United States Patent [19]
Murr

[11] Patent Number: 6,042,412
[45] Date of Patent: Mar. 28, 2000

[54] LAND GRID ARRAY CONNECTOR ASSEMBLY

[75] Inventor: Keith Murr, York, Pa.

[73] Assignee: The Whitaker Corporation, Wilmington, Del.

[21] Appl. No.: 09/143,563

[22] Filed: Aug. 28, 1998

[51] Int. Cl.$^7$ ............................................. H01R 13/62
[52] U.S. Cl. ............................................. 439/331; 439/73
[58] Field of Search ............................................. 439/330, 331, 439/71, 72, 73

[56] References Cited

U.S. PATENT DOCUMENTS

| | | | |
|---|---|---|---|
| 3,905,670 | 9/1975 | Anhalt et al. . | |
| 4,376,560 | 3/1983 | Olsson et al. . | |
| 4,699,593 | 10/1987 | Grabbe et al. | 439/71 |
| 4,906,194 | 3/1990 | Grabbe | 439/71 |
| 4,969,826 | 11/1990 | Grabbe | 439/66 |
| 5,061,191 | 10/1991 | Casciotti et al. | 439/66 |
| 5,199,889 | 4/1993 | McDevitt, Jr. | 439/66 |
| 5,224,865 | 7/1993 | Woith et al. | 439/67 |
| 5,232,372 | 8/1993 | Bradley et al. | 439/66 |
| 5,493,237 | 2/1996 | Volz et al. | 439/73 |
| 5,704,801 | 1/1998 | Walker et al. | 439/417 |
| 5,738,531 | 4/1998 | Beaman et al. | 439/71 |
| 5,766,022 | 6/1998 | Chapin et al. | 439/73 |

*Primary Examiner*—Lincoln Donovan
*Assistant Examiner*—Antoine Ngandjui

[57] ABSTRACT

A connector assembly featuring a socket for receiving a chip carrier insertable therein, whereby the socket is mountable to a circuit board; opposed arms extend from the socket; and actuators are movably secured between the opposed arms for urging the chip carrier towards said circuit board. The actuator is rotatable between an unactuated position and an actuated position on an axis of rotation extending between the arms. The actuator includes a cam portion between the opposed arms having an eccentric portion bearable against a top surface of the chip carrier for urging the chip carrier towards the circuit board.

11 Claims, 8 Drawing Sheets

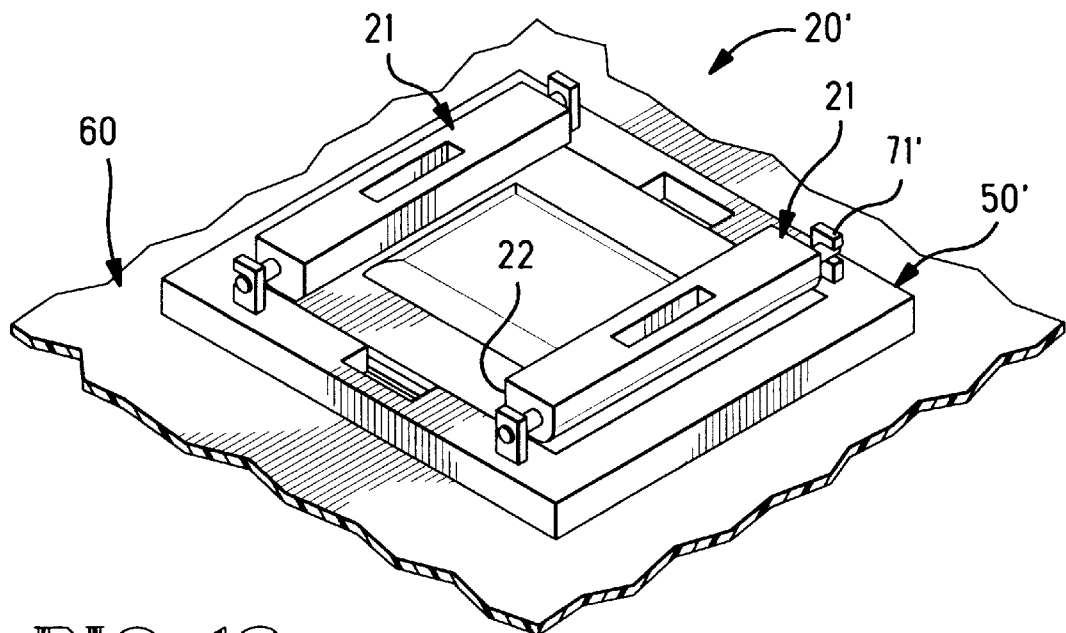
FIG. 12
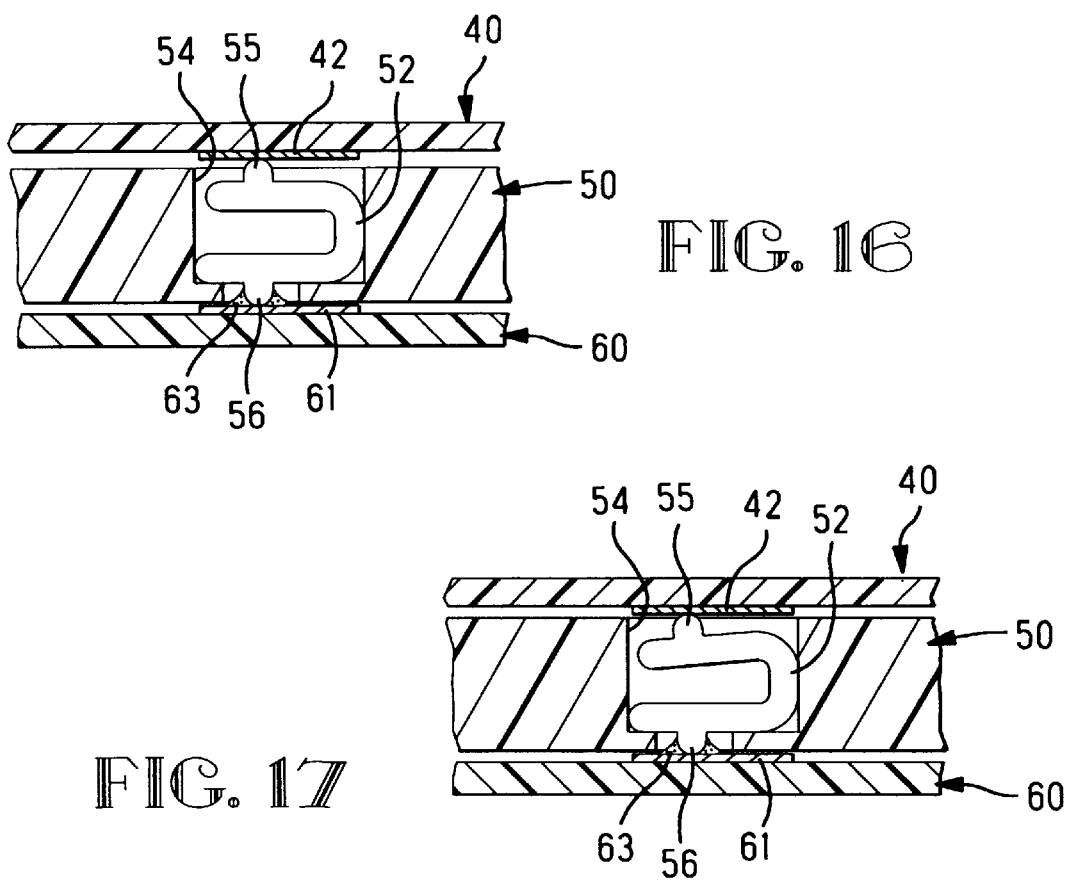
FIG. 16
FIG. 17

6,042,412

LAND GRID ARRAY CONNECTOR ASSEMBLY

FIELD OF INVENTION

The present invention relates to an electrical connector assembly of the land grid array (LGA) type to interconnect integrated circuits of a chip carrier or similar substrates to printed circuit boards, or other circuitized or metallized substrate. More particularly, the present invention relates to an actuator that compresses the chip carrier against the printed circuit board socket, which in turn electrically interconnects compressible contacts therebetween.

BACKGROUND OF THE INVENTION

The state of the art in the LGA type electrical connector assembly industry is to mount chip carriers or similar substrates to printed circuit boards (PCBs) utilizing an interposer therebetween. The interposer typically comprises a socket having a grid array of resilient and compressible contacts effecting electrical interconnection between corresponding grid arrays that are located on the chip carrier and the printed circuit board (PCB).

A need arises to provide an LGA connector which may be quickly assembled utilizing minimal steps and components, and without excessive application tools. A need also exists for minimizing the real estate the LGA connector would occupy, as well as minimizing the costs associated with fabricating the LGA connector.

The interposer connector assembly in Grabbe, U.S. Pat. No. 4,969,826, herein incorporated by reference, accomplishes the mating of the contacts with their respective pads by sandwiching the connector between the chip carrier and the PCB by means of a relatively rigid base and compression plate which are bolted together with the bolts.

A problem with this design is that the connector assembly requires a compression plate, as well as excessive hardware and application tooling. The bolts used for compressing the assembly are expensive to manufacture and requires large amount of time and effort on behalf of the assembler when assembling and disassembling the connector.

The LGA connector in Bradley et al., U.S. Pat. No. 5,232,372, herein incorporated by reference, utilizes a clamping lid, suitably formed of metal to include latches on opposite sides thereof that engage the housing through the underside thereof. The lid serves to provide a compressive force driving the chip carrier downwardly against the connector insert. This serves to compress springs thereof and interconnect the pads of the chip carrier to the pads of the board.

A problem with this design is that the clamping lid may subject the housing to warping or bending while being clamped onto the housing. As a result, this design requires that the connector insert have a relatively flexible planar so as to avoid the risk of breaking or cracking while the housing is subjected to any bending or warping.

The socket for a ceramic chip carrier in Olsson et al., U.S. Pat. No. 4,376,560, herein incorporated by reference, discloses a lid which is placed over the chip carrier and is rotatably advanced to press against the carrier, causing the carrier to resiliently deflect the terminals, and to seat against the base of the socket.

A problem with this design is that the associated ramping components for the lid and the socket, which provide the compressive properties on the connector, tend to be intricate and complex. As a result, the costs associated with manufacturing the lid and socket, such as required when molding and tooling the components, can be excessive. In general, excessive costs may attribute to a socket assembly being cost prohibitive to manufacture and sell in practice.

SUMMARY OF THE INVENTION

According to the invention, the connector assembly has a socket for receiving a chip carrier insertable therein, whereby the socket is mountable to a circuit board. Opposed arms extend from the socket, and actuators are movably secured between the opposed arms for urging the chip carrier towards said circuit board.

Further, the actuator is rotatable between an unactuated position and an actuated position on an axis of rotation extending between the arms. The actuator includes a cam portion between the opposed arms having an eccentric portion bearable against a top surface of the chip carrier, opposite the socket, for urging the chip carrier towards the circuit board.

The invention itself, together with further objects and attendant advantages, will best be understood by reference to the following detailed description taken in conjunction with the accompanying drawings.

BRIEF DESCRIPTION OF THE DRAWINGS

FIG. 12 shows a modification of FIG. 1 with a different design for securing the actuator, i.e., the opposed arms are mounted directly to the socket, rather than extending from a backer plate.

FIGS. 16 and 17 are cross-sectional views of the interconnection system of the present invention in the unactuated and actuated positions, respectively.

DETAILED DESCRIPTION OF THE INVENTION

Figure 1:
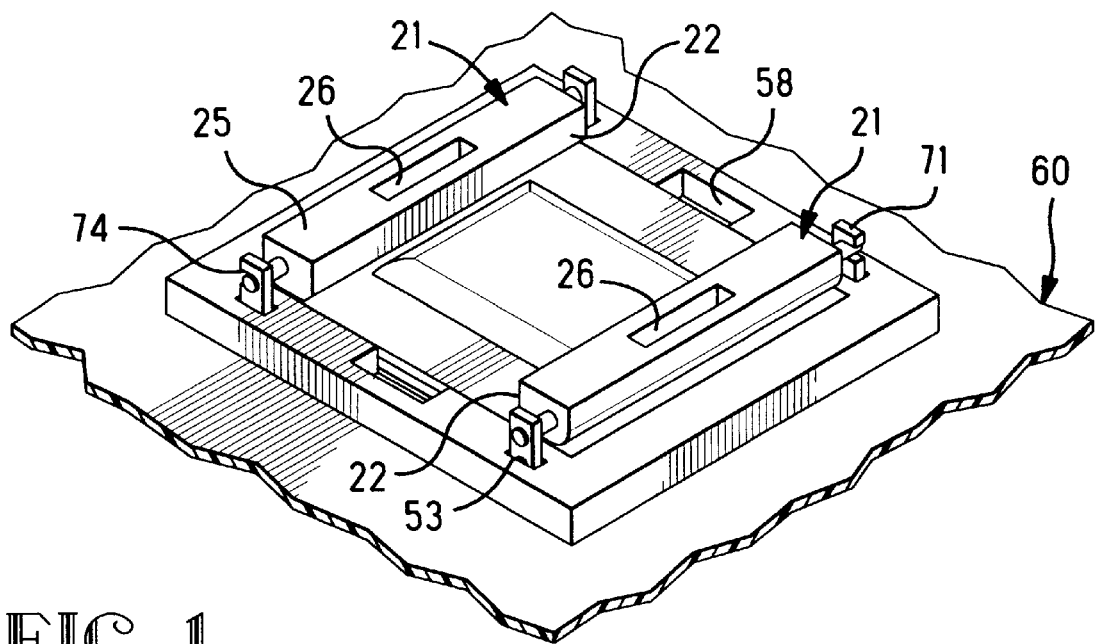
FIG. 1 is an isometric top view of the connector assembly of the present invention associated with a circuit board and heat plate.
Figure 11:
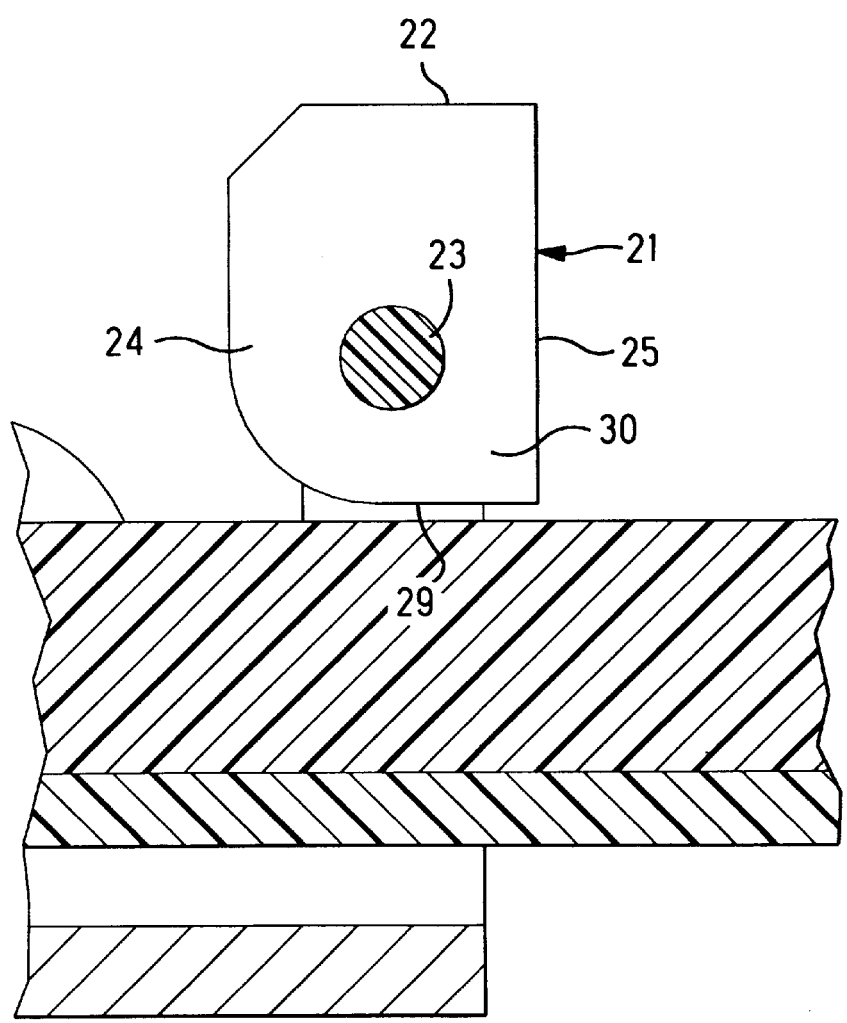
FIG. 11 is a substantially enlarged fragmented view of the subject matter of FIG. 9.
Figure 2:
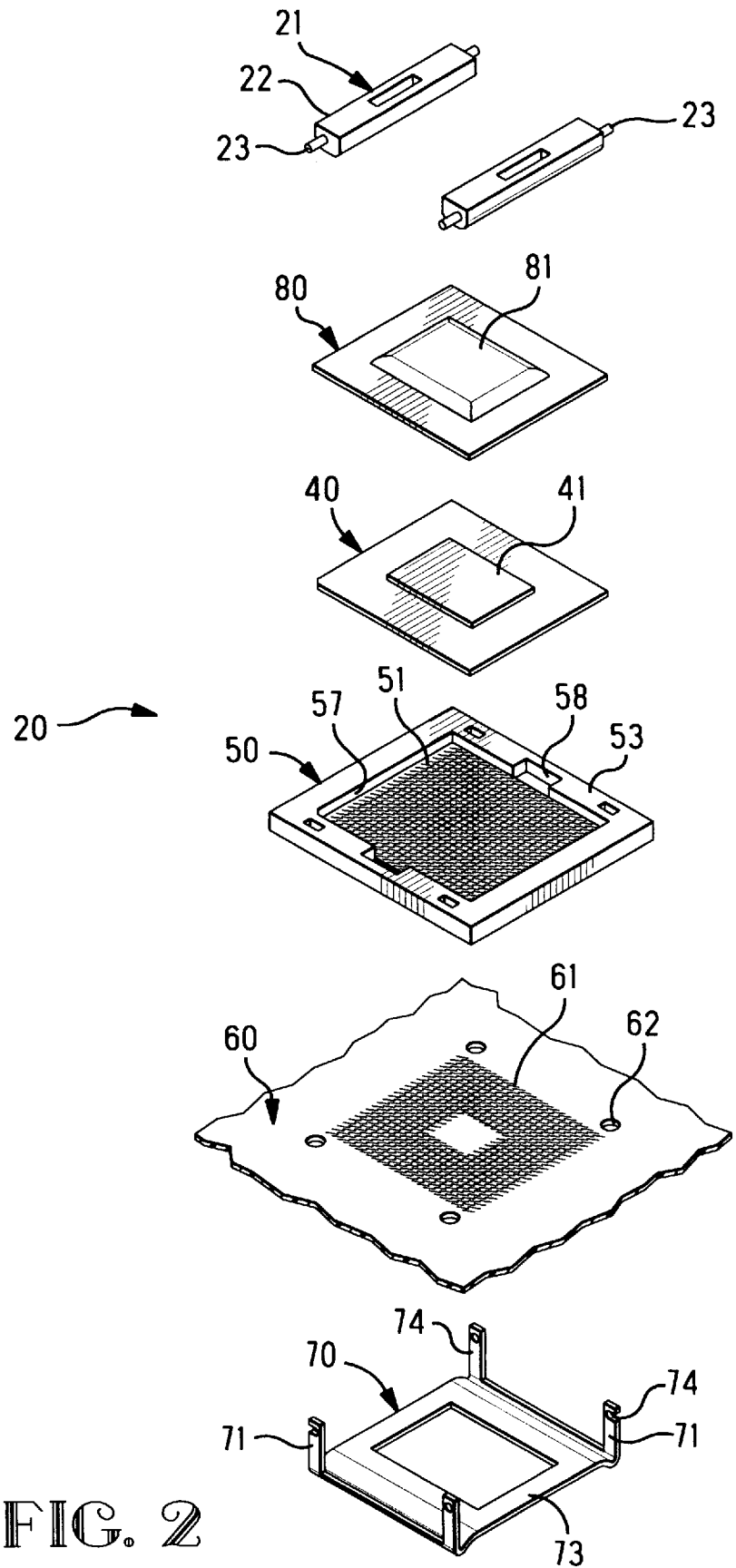
FIG. 2 is an exploded view of the connector assembly of the present invention and showing a circuit board, chip carrier, semiconductor, and heat plate in alignment with the connector assembly.
Figure 3:
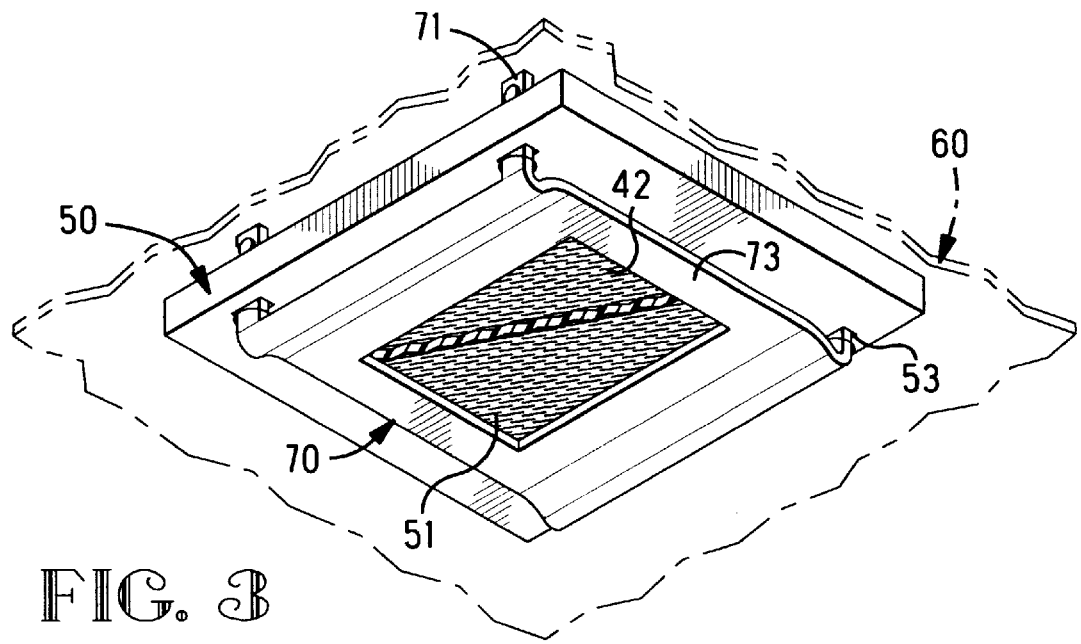
FIG. 3 is an isometric bottom view of the connector assembly of the present invention and showing a circuit board (phantom lines) associated with the connector assembly, and with the planar array broken away from the socket thereby showing the array of contact pads on the underside of the chip carrier.
Figure 4:
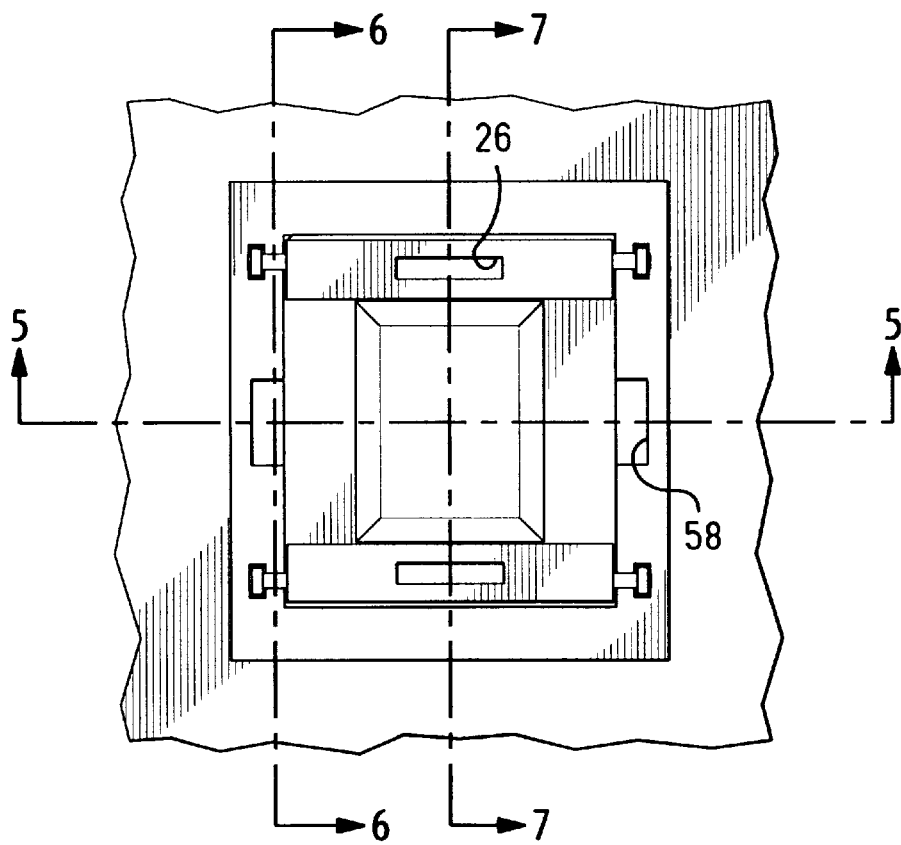
FIG. 4 is a plan view of the connector assembly of the present invention associated with a circuit board and heat plate.
Figure 5:
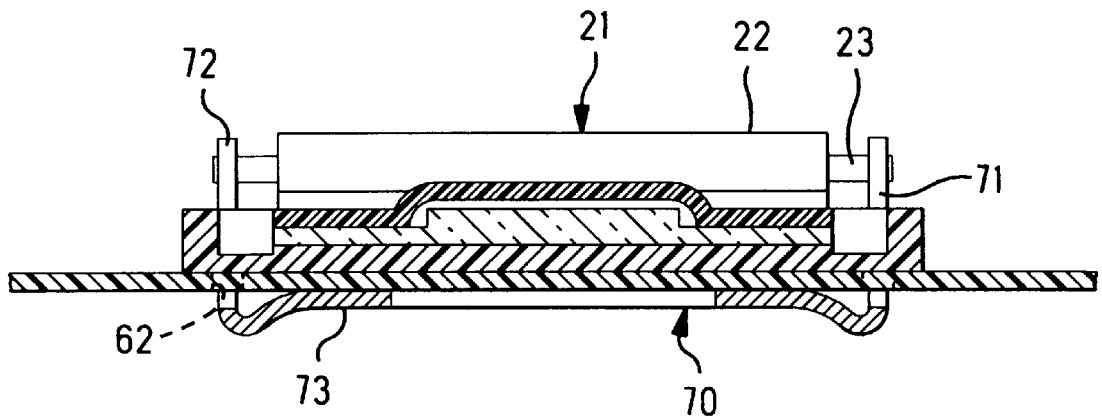
FIG. 5 shows a transverse sectional view of the connector assembly (looking in the direction of the arrows 5—5 of FIG. 4) in its actuated position of the present invention associated with a circuit board, chip carrier, semiconductor, and heat plate.
Figure 6:
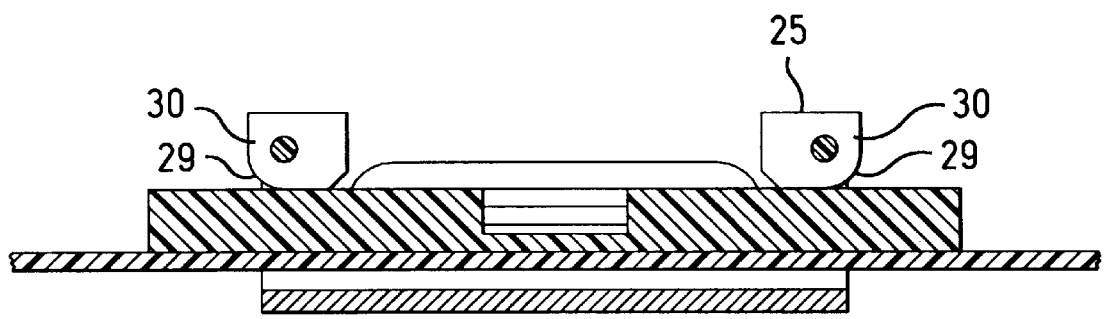
FIGS. 6 and 7 show longitudinal sectional views of the connector assembly (looking in the direction of the arrows 6—6 and 7—7, respectively, of FIG. 4) in its actuated position of the present invention associated with a circuit board, chip carrier, semiconductor, and heat plate.
Figure 7:
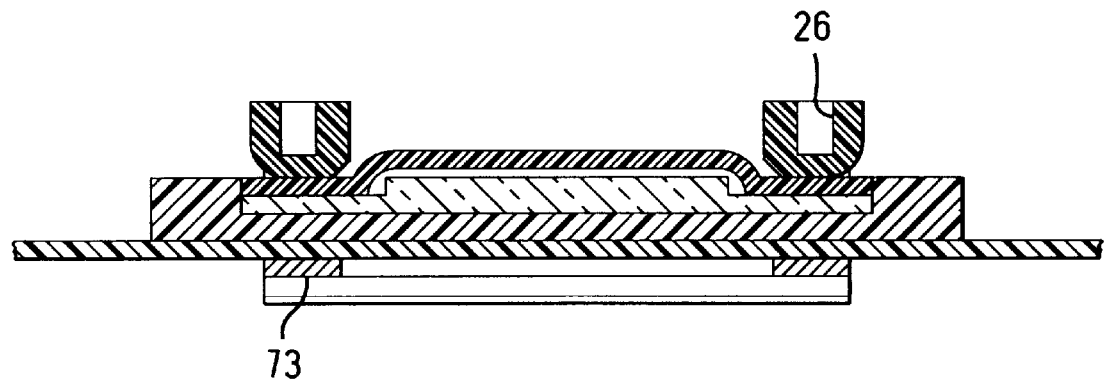
Figure 8:
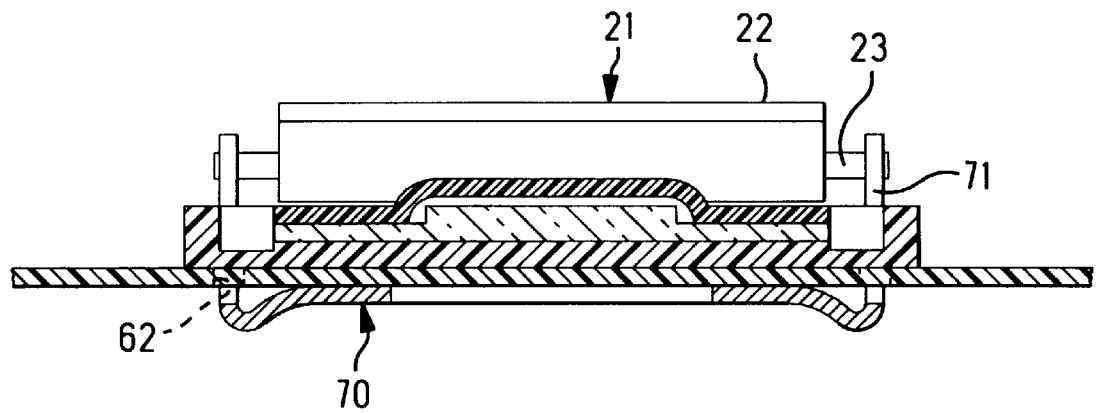
FIGS. 8, 9, and 10 are views similar to FIGS. 5, 6, and 7, respectively, but with the connector assembly in its unactuated position.
Figure 9:
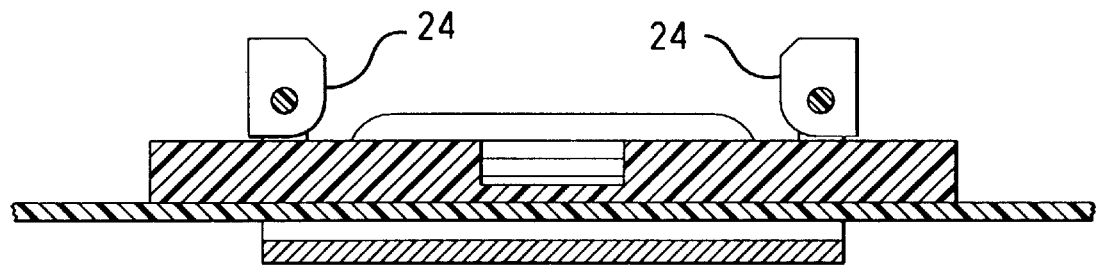
Figure 10:
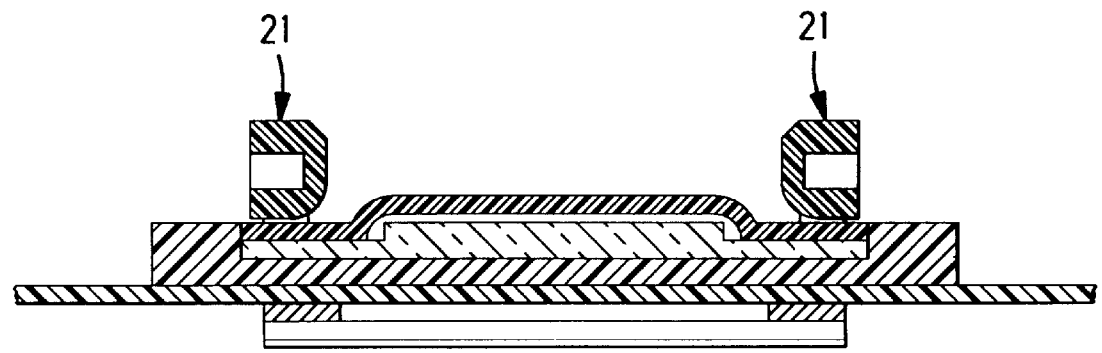

Turning now to the drawings, the subject invention, as shown in FIGS. 1–3, 5, 16, and 17 includes a connector assembly 20 for interconnecting an array of contact pads 42 on the bottom side of a integrated chip (IC) carrier 40 with an array of contact pads 61 on the top side of a printed circuit board (PCB) 60, or other circuitized or metallized substrate, which are understood to be connected to traces (not shown) within laminations of the circuit board 60. A socket 50 is mounted on top of the circuit board 60 and includes a conductive element planar array 51 comprised of resilient compressible conductive elements 52 that electrically interconnect the contact pads 61 on the circuit board 60 with the contact pads 42 on the underside of the chip carrier 40. Should it be desirable, a heat plate 80 may be disposed on top of the chip carrier 40 serving as a heat sink to dissipate the heat generated from the chip carrier 40 when in operation. This is a particularly desirable feature should the chip carrier 40 include a semiconductor (SC) chip(s) 41, which is known to operate at relatively high temperatures and which requires effective heat sinking means to avoid possible destruction thereof. Also, should it be desirable to provide rigidity to the socket 50, a back plate 70 is provided against the bottom of the circuit board 60 having opposed arms 71 extending therefrom. Two elongated actuators 21 are located above the chip carrier 40 and heat plate 80, and are rotatably secured on an axis of rotation between the opposed the arms 71.

While the aforementioned present invention connector assembly 20 has disclosed a planar array 51 of the LGA type, the present invention can be adapted for conventional ball grid array (BGA) and pin grid array (PGA) types as well.

Next, details relating to the backer plate 70 and the opposed arms 71 will be provided, as best shown in FIGS. 1–3, and 5–10. Should it be desirable, a backer plate 70 is provided having a plate-contact portion 73 that contacts the bottom of the circuit board 60 and has the opposed arms 71 extending therefrom and terminating at their mounting ends 72 distal from the plate-contact portion 73. The plate-contact section 73 is generally planar and is open in the center so as to reduce material costs and weight, as well as to improve heat dissipation.

The opposed arms 71 pass through four arm-receiving holes 53,62 located generally on the four corners of the socket 50 and circuit board 60, respectively, and terminate above the chip carrier 40 and heat plate 80 at their mounting ends 72 distal from contact portion 73. The opposed arms 71 include a mounting-aperture 74 at their respective mounting ends 72 thereof cooperable with a cylindrical portion 23 of the actuator 21. The cylindrical portions 23 are rotatably secured on an axis of rotation between the opposed the arms 71. Each actuator respectively has one mounting-aperture 74 having a closed configuration and one aperture 74 having an open-ended configuration to thereby facilitate slidably positioning the cylindrical portions 23 of the actuators between the opposed arms 71 (described below).

Next, details relating to the printed circuit board (PCB) 60 will be provided, as best shown in FIGS. 1–3 and 16–17. The circuit board 60, or other circuitized or metallized substrate, which are understood to be connected to traces (not shown) within laminations of the circuit board 60, have an array of contact pads 61 that correspond to an array of contact pads 42 on the bottom side of the chip carrier 40. These traces interconnect other arrays and various components to provide a given function to a device such as a computer, communication equipment, or the like. The circuit board 40 has arm-receiving holes 62 generally located at its corners for receiving the opposed arms 71.

Next, details pertaining to the socket 50 will be discussed, as best shown in FIGS. 1–3 and 16–17. The socket 50 has a central chamber 57 adapted for a conductive element planar array 51 therein. While the conductive element planar array 51 is integral with the socket 50 in the present invention, an alternate embodiment may have a socket 50 that is adapted for receiving the array 51 as a separate insert therein. The conductive element planar array 51 comprises a plurality of socket cavities 54 that are aligned with the corresponding chip carrier contact pads 42 and the circuit board contact pads 61. Each of the socket cavities 54 has a resilient compressible conductive element 52 therein which extends between corresponding contact pads 42, 61 of the chip carrier 40 and circuit board 60, respectively. Each of the compressible conductive elements 52 has an opposing chip carrier-end 55 and a circuit board-end 56. The present invention has the circuit board-end 56 of the compressible conductive elements 52 affixed at 63 to the circuit board contact pad 61 via a solder ball or paste, using conventional reflow soldering methods (FIG. 17).

The socket 50 has the arm-receiving holes 53 generally located at its corners for receiving the opposed arms 71. Also, intermediately located on two opposite sides of the socket 50 are tool-wells 58 used for receiving application tools for the purpose of removing any components (e.g., chip carrier 40, SC 41, or heat plate 80) that may be stacked inside the central chamber 57 and on top of the conductive element planar array 51.

When the connector assembly 20 is in its unactuated position (FIG. 16) the compressible conductive elements 52 are in its free uncompressed position. In turn, chip carrier-end 55 protrudes out of the socket cavity 54 and the chip carrier 40 is free floating thereon the planar array comprising of carrier-end 55 protrusions (additional unactuated position details to be provided below).

In contrast, when the connector assembly 20 is in its actuated position (FIG. 17) a force is applied downwardly on the chip carrier 40 which then compresses the conductive elements 52 to effect a reliable electrically contact between the chip carrier 40, at its respective contact pads 42, and the circuit board 60, at its respective contact pads 61 (additional actuated position details to be provided below).

Next, details relating to the chip carrier 40 and the heat plate 80 will be discussed, as best shown in FIGS. 1, 2, and 5–10. The chip carrier 40, which typically has a semiconductor (SC) chip 41 or die mounted and electrically connected thereon, is configured in a two-tier configuration. In accordance with some of the principles of this invention, the chip carrier 40 can be inserted into the central chamber 57 of the socket 50 since the central chamber 57 is complementary to the outer periphery of the chip carrier 40.

The heat plate 80 may also be configured to correspond to periphery of the central chamber and to match the outer periphery of the chip carrier 40. In addition, the center of the heat plate 80 is configured as a raised plate 81 so as to be compatible with the two-tier configuration of the semiconductor 42 mounted upon the chip carrier 40. Accordingly, the heat plate 80 can be inserted into the central chamber 57 of the socket 50, and on top of the SC 41 and chip carrier 40.

Next, details relating to the elongated actuator 21 will be provided, as best shown in FIGS. 1, 2, 5–11, 14, and 15. Each of the elongated actuators 21 are movably attached to mounting ends 72 of the opposed arms 71. The opposed arms have mounting apertures 74 at their mounting ends 72 for receiving the cylindrical portion 23 of the elongated actuators 21, which allows the actuators 21 to rotate there between on an axis of rotation extending between the arms 71. The elongated actuator 21 includes a central body section defining a cam 22 having an eccentric cross-section defining an eccentric portion 24 bearing against the heat plate 81 between opposed arms 71 when in the actuated position. Alternatively, if the assembly 20 is absent a heat plate 80, then the eccentric portion 24 would bear directly against the chip carrier 40. Each of the cams 22 include a top wall 25 having a tool-recess 26, whereby the tool-recess 26 is longitudinally located intermediately on the top wall 25. The tool-recess 26 is adapted to receive a tool such as a screwdriver blade for the purpose of tool-assisted actuation of the elongated actuator 21. Further, each of the cams 22 include a side interior wall 28 on the side of the cam 22 which is closest to the center of the connector assembly 20 while in the actuated position. Next, the cams 22 include a side exterior wall 29, which is opposite the interior wall 28 and which forms an unactuated portion 30 of the cam 22.

With reference to FIG. 1, the connector assembly 20 with its associated components is assembled by mounting the socket 50 onto the PCB 60 using conventional reflow soldering methods. The chip carrier 40 and SC 41 are then set into the central chamber 57 of the socket 50, followed by the heat plate 80, if applicable. Next, the backer plate 70 is attached by inserting the opposed arms 71 through the arm-receiving holes 62, 53 of the circuit board 60 and socket 50, respectively. It should be noted that the opposed arms are prestressed inwardly, whereby they resiliently grip the circuit board 60 and socket 50 once they are disposed through their respective arm-receiving holes 62, 53. The resilient grip helps to retain the circuit board 60 and chip carrier 40 in place during assembly. Thereafter, the elongated actuators 21 are secured between the opposed arms while in an unactuated position.

Next, details relating to the actuation of the connector assembly 20 will be discussed, as best shown in FIGS. 1, 5–11, and 14–17. Upon actuation of the elongated actuator 21 by a tool-assisted rotation thereof, the eccentric portion 24 bears against the heat plate 81 urging the heat plate 81 downward against the chip carrier 40, which then bears downward against the compressive conductive elements 52 of the conductive element planar array 51. The conductive elements 52 are in respective engagement with their respective contact pads 42 and 61 causing the conductive elements 52 to deflect as the chip carrier 40 is urged downward. Accordingly, when the actuator 21 is actuated, the heat plate 80 and chip carrier 40 is urged downward, the conductive elements 52 are compressed and its inherent resiliency results in the provision of a contact force to insure good electrical contact between the contact ends 55 and 57 and the contact pads 42 and 61, respectively.

Other means of actuation are of course possible with the present invention, including providing some form of projecting boss (not shown) at the outer ends of the cylindrical portions 23, such as one that might be effectively engaged either manually or by a wrench.

In contrast, details relating to switching the connector assembly 20 from the actuated position to the unactuated position, as well as removing the stacked devices out from the assembly 20, will be discussed, as best shown in FIGS. 1, 5–11, and 14–17. The elongated actuator 21 may be returned to an unactuated position by a tool-assisted rotation thereof (in a direction opposite the rotation for actuation) whereby the eccentric portion 24 is rotated away from contacting the heat plate 81. Instead, the exterior wall 29 of the unactuated portion 30 faces the heat plate 81, and may contact the heat plate 81 with negligible force. In turn, any compressive downward pressures that were previously exerted against the heat plate 81, chip carrier 40, and the compressive conductive elements 52 of the conductive element planar array 51 are now eliminated.

Accordingly, when the actuator 21 is unactuated the conductive elements 52 return to their relaxed, uncompressed, state due to their inherent resiliency. This interrupts the contact forces required for insuring good electrical contact between the contact ends 55 and 57 and the contact pads 42 and 61, respectively.

As the connector assembly 20 is in an unactuated position, as shown in FIGS. 8–11 and 15, the gap depicted between the exterior wall 29 of the actuator and the heat plate 80, may be exaggerated for illustration purposes. That is, it is possible for the actuator 21 to be in an unactuated but still in contact with the heat plate 80 surface. However, the force would be negligible and certainly not enough to apply any measurable compressive forces on the compressible element conductive elements 52, as is the case in the actuation position.

In fact, while the connector assembly 20 is in the unactuated position, it is adapted to permit an assembler to insert or remove the chip carrier 40, semiconductor 41, and heat plate with little or no obstruction from the actuator 21. Particularly, a chip carrier 40, semiconductor 41 and heat plate may be removed from the connector assembly 20 by inserting an assisting-tool (such as a blade from a screwdriver) in opposed tool-wells 58 located in the socket, and then lifting up on the devices for effecting their removal.

Figure 14:
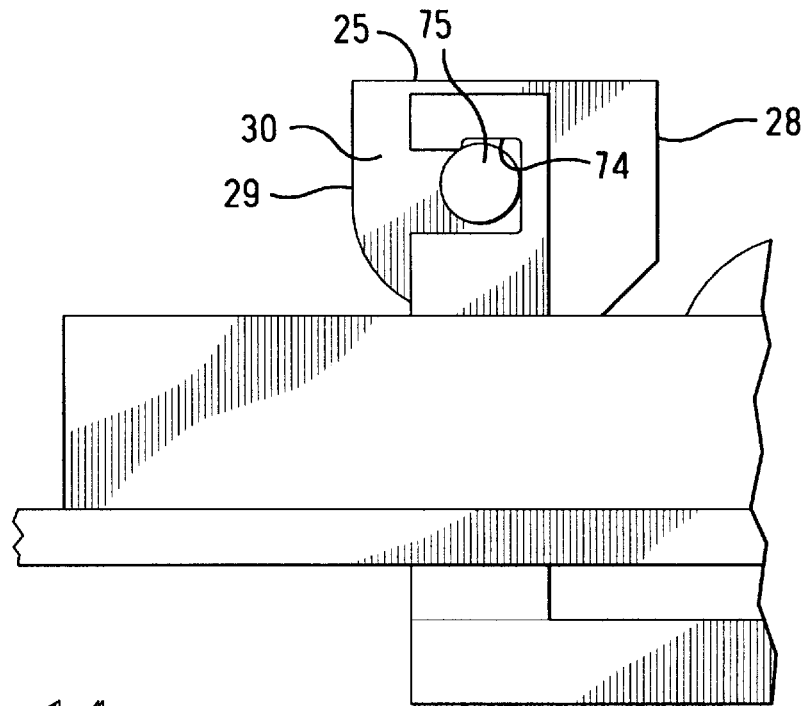
FIG. 14 is a substantially enlarged fragmented side view of the subject matter of FIG. 1 showing the actuator axially mounted in an actuated position as the cylindrical portion of the actuator is urged upward into the bight of the mounting aperture.
Figure 15:
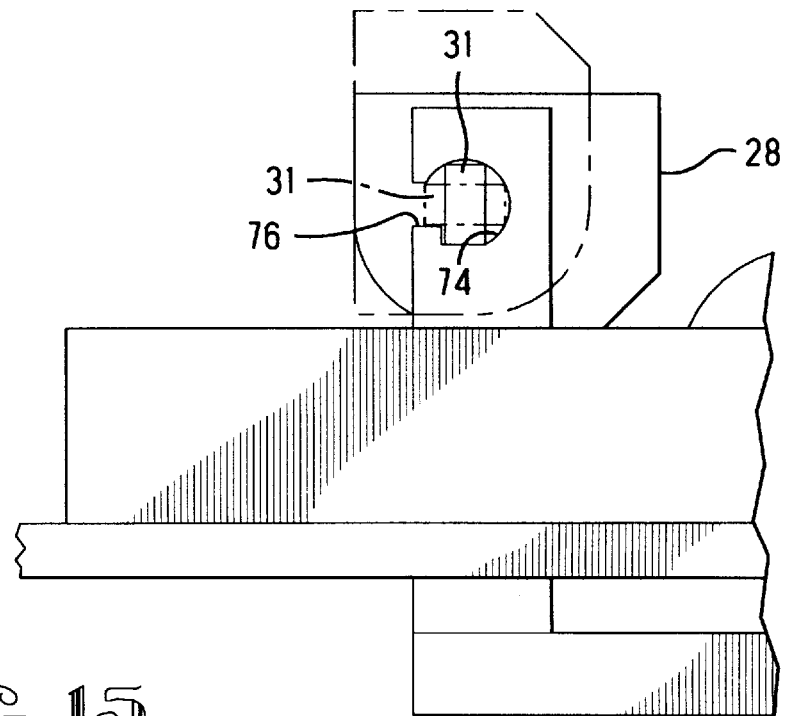
FIG. 15 is a view similar to the subject matter of FIG. 14 showing the actuator axially mounted in unactuated (phantom lines) and actuated positions (solid lines), and showing an alternative form of the present invention whereby the actuator has a rectangular post that contacts the stop wall of the mounting-aperture of the arm while in its actuated position.

Next, details relating to the mounting apertures 74 of the opposed arms 71, and how these components relate to the elongated actuator 21 will be discussed, as best shown in FIGS. 14 and 15. As mentioned previously, the opposed arms 71 have mounting apertures 74 at their mounting ends 72 for receiving the cylindrical portion 23 of the elongated actuators 21, thereby effecting an axis of rotation extending between the arms 71. Each actuator 21 respectively has one mounting-aperture 74 having a closed configuration and one aperture 74 having an open-ended configuration to thereby facilitate slidably positioning the cylindrical portions 23 of the actuators between the arms 71. The open ended aperture 74 may include a bight 75 (FIG. 14) for accommodating the cylindrical portion 23 and preventing the cylindrical portion 23 from being dislodged during actuation. In particular, upon actuation of the elongated actuator 21 by a tool-assisted rotation thereof, the eccentric portion 24 bears down against the heat plate 81 urging the heat plate 81 downward against the chip carrier 40, while at the same time the actuation may urge the axis of the cylindrical portion 23 upward and into the bight 75. The cylindrical portion 23 being disposed in the bight 75 prevents the cylindrical portion 23 from inadvertently dislodging during actuation and operation of the assembly 20.

Variations of the embodiments described above are possible. For example, the present invention, as depicted in FIG. 15, includes opposed arms 71 having open configured mounting-apertures 74 having a stop wall 76. Moreover, the actuators 20 include a post 31 having a rectangular cross-section in lieu of the aforementioned cylindrical portion 23. In the unactuated position (depicted by phantom lines), the rectangular post 31 is adapted to be slidably insertable in the mounting-aperture 74. As the actuator 21 is rotated into its actuated position, the post 31 abuts against the stop wall 76 and, thereby, prevents the post 31 and actuator 21 from inadvertently being dislodged during actuation and operation of the assembly 20.

In another variation, the assembly 20 includes opposed arms 71 having only closed configured mounting-apertures 74. Without having the benefit of open configured mounting-apertures 74 used for slidably receiving the cylindrical portions 23 of the actuator 21, the assembler would be required to accommodate the actuator 21 by bending the opposed arms 71 outward while securing the actuator 23 there between.

Figure 13:
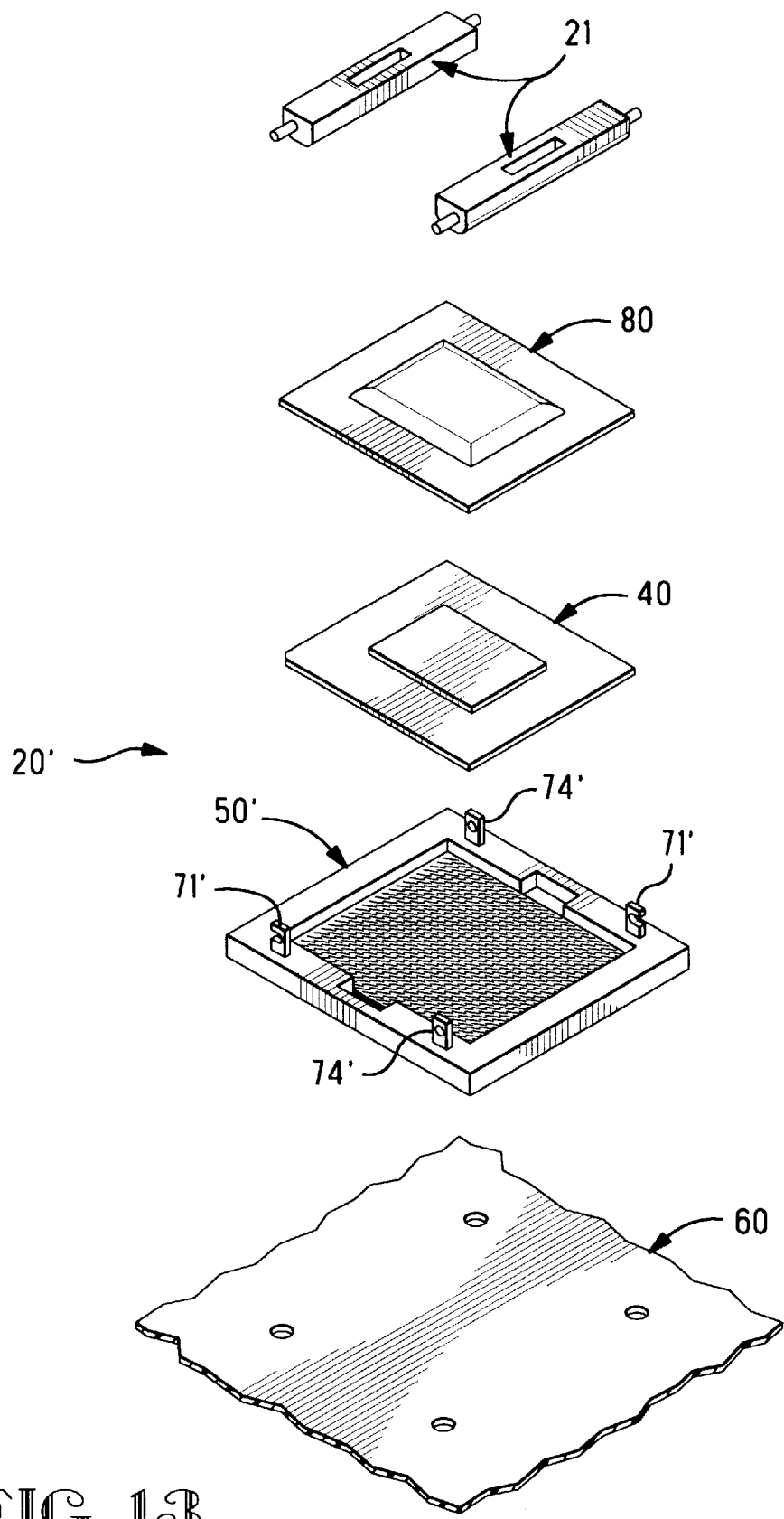
FIG. 13 is an exploded view of an alternative form of a connector assembly of the present invention without a backer plate (i.e., the subject matter as depicted in FIG. 12), and showing a circuit board, chip carrier, semiconductor, and heat plate in alignment with the connector assembly.

As best shown in FIGS. 12 and 13, another variation of the present invention is to provide an assembly 20' without a backer plate 70. This variation of the present invention includes having the opposed arms 71', 74' originating and extending directly out of the socket 50', rather than from a backer plate 70. As heretofore described, the two elongated actuators 21 are located above the chip carrier 40 and heat plate 80 and are movably attached between the opposed the arms 71', 74'. However, without having the benefit of the rigidity normally provided by a backer plate 70, this variation of the present invention should be adapted accordingly. For instance, the socket 50' may be manufactured having a predesigned material or predesigned load bearing dimensions and configurations that provide the requisite rigidity for supporting the conductive element planar array 51. Another possibility is to provide a more flexible planar array 51, which is less susceptible of being damaged and broken when exposed to flexing, bending or warping.

In yet a further variation of the application of the present invention, the assembly 20 may be utilized without an associated heat plate 80. In this variation, the eccentric portion 24 and the unactuated portion 30 would come directly in contact with the chip carrier 40, rather than with the heat plate 80, and in accordance with aforementioned principles of this invention, the actuation forces would be exerted downward on the chip carrier 40 and compressible conductive elements 52.

Further yet, other variations of the application of the present invention, may include compressible conductive elements 52 having a plethora of configurations. For instance, rather than a generally C-shaped conductive element 52 as depicted in FIGS. 16 and 17, the elements may be V-shaped, S-shaped, serpentine-like shaped, or the like.

The embodiments described above provide a number of significant advantages. An advantage of the present connector assembly 20 is attributed to its elongated actuator 21, which facilitates assembly and disassembly. The present invention eliminates the nut and bolt compressors as well as their associated compression plates. Moreover, the present invention requires less space and fewer components than the aforementioned prior art, which in turn decreases manufacturing costs, assembly costs, and real estate.

In yet another advantage of the connector assembly 20 is that it avoids utilizing clamping lids, which may exert bending or warping while being installed onto the socket. As a result, the clamping lid design may restrict the connector assembly to having to utilize a flexible conductive element planar array 51 so as to accommodate any incidental bending and warping incurred by the socket. Therefore, the present invention provides a connector assembly 21 that is more versatile, i.e., adaptable for either rigid or flexible conductive element planar arrays 51.

Finally, the present invention avoids using ramping systems that tend to be relatively intricate and complex to manufacture. In contrast, the present invention actuator 21 provides an economy of parts as a result of its relatively simple design, and, thereby, reduces the overall manufacturing costs of the connector assembly 20.

Of course, it should be understood that a wide range of changes and modifications could be made to the preferred embodiment described above. It is therefore intended that the foregoing detailed description be understood that it is the following claims, including all equivalents, which are intended to define the scope of this invention.

I claim:

1. An electrical connector assembly comprising:
   a socket for receiving a combined structure of a chip carrier that carries a chip having an integrated circuit,
   compressible conductive elements for connecting the chip to a circuit board,
   one or more rotatable actuators,
   projecting arms extending upward from the socket, each of the projecting arms rotatably mounting one of the rotatable actuators,
   each rotatable actuator having a first wall thereon that is rotatable toward the combined structure to urge the combined structure downward in the socket and into compression against the compressible conductive elements to interconnect the chip to the circuit board,
   the first wall on each rotatable actuator being rotatable away from the combined structure, and
   each rotatable actuator having a second wall thereon that is rotatable toward the combined structure upon the first wall being rotated away from the combined structure, the second wall being spaced from the combined structure while being toward the combined structure, which removes the compression against the compressible conductive elements.

2. An electrical connector assembly, as recited in claim 1, wherein each rotatable actuator has a tool receiving portion against which a tool is urged, and whereby each rotatable actuator is urged to rotate by receiving a tool that is urged against the tool receiving portion.

3. An electrical connector assembly, as recited in claim 1, wherein each rotatable actuator is gripped between a pair of the arms that are prestressed toward each other to grip the rotatable actuator.

4. An electrical connector assembly, as recited in claim 1, wherein the socket is gripped by one or more pairs of the arms, each pair of the arms is received through the socket, and the arms of each pair of the arms are prestressed toward each other to grip the socket.

5. An electrical connector assembly, as recited in claim 1, wherein each rotatable actuator is gripped between a pair of the arms that are prestressed toward each other to grip the rotatable actuator, the pair of the arms pass through the socket, and the arms of the pair of the arms are prestressed toward each other to grip the socket.

6. An electrical connector assembly, as recited in claim 1, wherein the arms are on a back plate, and the arms extend from the back plate and through the socket.

7. An electrical connector assembly, as recited in claim 1, wherein the arms are on a back plate, the arms extend from the back plate and extend through the socket, and the socket is gripped by the arms of a pair of the arms that are prestressed toward each other to grip the socket.

8. An electrical connector assembly, as recited in claim 1, wherein the arms are on a back plate, and the circuit board and the socket are gripped by having the arms extending from the back plate and through the circuit board and through the socket, with the arms being prestressed into gripped engagement on the socket.

9. An electrical connector assembly, as recited in claim 1, wherein the combined structure of the chip and chip carrier further comprises a heat plate covering the chip.

10. An electrical connector assembly, as recited in claim 1, wherein the socket has the compressible conductive elements therein.

11. An electrical connector assembly, as recited in claim 1, wherein the socket has a chamber receiving therein the combined structure, and the socket has recessed tool receiving wells near the chamber in which tools are received to remove the combined structure from the chamber.

* * * * *